(12) United States Patent
Lu et al.

(10) Patent No.: US 6,972,988 B1
(45) Date of Patent: Dec. 6, 2005

(54) STATE SAVE-ON-POWER-DOWN USING GMR NON-VOLATILE ELEMENTS

(75) Inventors: Yong Lu, Rosemount, MN (US); Romney R. Katti, Maple Grove, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/637,145

(22) Filed: Aug. 8, 2003

(51) Int. Cl.[7] .............................................. G11C 11/00
(52) U.S. Cl. ...................... 365/158; 365/171; 365/226; 307/48
(58) Field of Search ................................ 365/158, 171, 365/241, 226; 307/43–46, 48, 64, 66

(56) References Cited

U.S. PATENT DOCUMENTS 6,178,111 B1    1/2001   Sather et al. ............... 365/158
6,317,359 B1 *  11/2001  Black et al. ................ 365/158
6,542,000 B1 *  4/2003   Black et al. ................ 326/39

\* cited by examiner

*Primary Examiner*—Richard Elms
*Assistant Examiner*—Pho M. Luu
(74) *Attorney, Agent, or Firm*—Knobbe, Martens, Olson & Bear, LLP

(57) ABSTRACT

The semiconductor industry seeks to reduce the risk of traditional volatile storage devices with improved non-volatile storage devices. The increased demand for a significantly advanced, efficient, and non-volatile data retention technique has driven the development of integrated giant-magneto-resistive (GMR) structures. A non-volatile logic state retention devices, such as GMR storage elements, and concerns a save-on-power-down circuit that may be integrated with conventional semiconductor-based computing, logic, and memory devices to retain volatile logic states and/or volatile digital information in a non-volatile manner.

27 Claims, 3 Drawing Sheets

STATE SAVE-ON-POWER-DOWN USING GMR NON-VOLATILE ELEMENTS

This invention was made with Government support under Contract Number N00030-99-C-0019 awarded by Charles Stark Draper Laboratory. The Government has certain rights in this invention.

BACKGROUND OF THE INVENTION

1. Field of the Invention

The present invention relates to volatile memory and, in particular, refers to a method and device for providing a write current for storing a digital logic state in a giant magneto-resistance (GMR) element during a power down event.

2. Description of the Related Art

Since the introduction of the digital computer, electronic storage devices have been a vital resource for the retention of binary data. Conventional electronic storage devices, such as static random access memory (SRAM) and dynamic random access memory (DRAM), have been successfully integrated into computing devices for storing digital information. SRAM storage devices utilize static latch structures as storage cells. Typically, an SRAM latch structure is a complementary metal-oxide semiconductor (CMOS) circuit comprising two cross-coupled inverters, wherein the simultaneous activation of two access transistors regulates the flow of current through the cross-coupled inverter circuits for read and write functions. In addition, DRAM storage devices typically incorporate an inline access transistor and a capacitor type structure that are configured to temporarily store one bit of binary information based on the charged state of the capacitor.

Unfortunately, SRAM and DRAM require a continuous supply of power to maintain a particular defined logic state, and DRAM capacitors further require a periodic charge refresh from the inline access transistor to maintain the particular defined logic-state. Therefore, conventional semiconductor random access memory (RAM) is considered volatile memory due to the fact that data may be lost with the loss or interruption of power.

Preventing the loss of data during power interrupts has its disadvantages. Typical systems utilize a primary power source for normal applications and an auxiliary power source for back-up power in case the primary power source fails. The auxiliary power source may be employed within the system to increase the reliability of conventional memory devices in the event of a power failure. Implementing this approach may be cumbersome and inconvenient in that additional devices and circuitry, including the auxiliary power source and power switching circuitry, may be required. In addition, the auxiliary power source usually comprises a battery or the like that has a finite or limited lifetime. Therefore, if the primary power source fails for an extended period of time, the auxiliary power source may also eventually fail causing the conventional memory devices to lose the logic states or data stored therein due to the extended period of time of the power failure.

In some circumstances, conventional memory devices may be replaced with non-volatile memory devices, such as giant magneto-resistive (GMR) devices, such that volatile logic states may be stored in a non-volatile manner. Although GMR devices may facilitate the adverse effects of losing data during power interrupts, GMR devices typically require a current pulse sufficiently capable of generating orthogonal magnetic fields, which may be difficult to implement during loss of power. Auxiliary power sources may be used to provide enough power for storing logic states in GMR devices, but the additional cost associated with using auxiliary power components may deter the use thereof.

Based on the foregoing, there currently exists a need to replace conventional volatile memory devices and circuitry with improved solid-state non-volatile memory devices and circuitry so as to substantially preserve logic states in a non-destructive manner during an interrupt in power. Furthermore, there also exists a need to develop non-volatile memory devices that may be used in conventional applications without compromising the high-density fabrication and processing techniques.

SUMMARY OF THE INVENTION

The present invention provides a method and device that senses a power down sequence and provides a write current for storing a digital logic state retained in a volatile memory device to a non-volatile GMR memory device. In one embodiment, aforementioned needs may be satisfied by a memory device having a data line and a GMR storage circuit, wherein the memory device comprises at least one GMR storage cell that is coupled to the data line wherein the GMR storage cell magnetically stores a value indicative of the value of the data line upon receipt of a pre-selected storage signal. The memory device further comprising a power down detector that detects when power to the memory device is being lost and generates the pre-selected storage signal, wherein the power down detector is adapted to provide a pre-selected storage signal that has a sufficient pulse width to change the magnetic state of the GMR storage cell when detecting that the power to the memory device is being lost.

Additionally, the power down detector may include a charge storage device that stores charge during normal operation of the memory device and wherein the charge storage device provides the charge when the power is being lost to develop the pre-selected storage signal. The power down detector may also include a pulse generating circuit that receives the charge and converts the charge into a pulse output signal having a pulse width. In one aspect, the pulse generating circuit may include a logic gate having a first and second input and a delay circuit wherein the charge from the charge storage device is simultaneously applied directly to the first input of the logic gate and to the delay circuit and wherein the delay circuit provides an input signal to the second input of the logic gate a pre-selected time period after the application of the charge to the first input of the logic gate.

Moreover, the logic gate may provide the pulse output signal that changes from a first state to a second state upon receipt of the input signal on the first input and then changes back to the first state upon receipt of the input signal from the delay circuit on the second input such that the output from the logic gate comprises a pulse output signal that is in the second state for a pre-selected pulse width. In addition, the logic gate may comprises a NAND gate and the second state comprises a negative state.

In one aspect, the memory device may further comprise an output transistor that receives charge from the charge storage device and wherein the output transistor is activated by the pulse output signal such that the charge from the charge storage device is transmitted through the output transistor to the GMR device to produce the pre-selected storage signal. In addition, the memory device may also comprise an isolation transistor interposed between the charge storage device and the power supply and an inverter that is coupled to the power supply so as to provide an output to the pulse generating circuit that is a rising edge signal in response to receiving a falling edge signal from the power supply indicative of the power to the memory device being lost.

In another aspect, the at least one GMR storage cell may comprise at least one of a first magnetic layer that is magnetized in a first fixed direction, a second layer that can be magnetized in either the first fixed direction or a second direction that is opposite the first direction, and a spacing layer interposed between the first magnetic layer and the second magnetic layer. In addition, the GMR storage circuit comprises a first conductive trace and second conductive trace that is substantially perpendicular to the first conductive trace, wherein the intersection point at which the first and second conductive traces is proximate to the at least one GMR storage cell. Moreover, a first component of the pre-selected storage signal is provided to the at least one GMR storage cell via the first conductive trace. Also, the GMR storage circuit may comprise at least one access transistor interposed between the data line and the GMR storage cell, wherein a second component of the pre-selected storage signal is provided to the at least one GMR storage cell via the second conductive trace upon activation by the data line.

In another embodiment, the aforementioned needs may be satisfied by an electronic device having a first and second input, wherein the electronic device comprises a pulse generating circuit that senses a power interrupt, receives a power interrupt signal at the first input, and generates a negative-level pulse signal upon sensing the power interrupt and upon receiving the power interrupt signal, a transistor that receives the negative-level pulse signal and generates a positive-level pulse signal so as to produce a write current, and a memory circuit that receives the write current and stores a volatile logic state sensed at the second input in at least one GMR storage element, wherein the at least one GMR storage element stores the volatile logic state in a non-volatile manner.

In yet another embodiment, the electronic device, having a data line and a GMR storage cell, may comprise an isolation transistor that senses a power failure and isolates a supply voltage from an operating voltage, a charge storage device that stores the operating voltage and discharges the operating voltage when the power failure is sensed by the isolation transistor, and an inverter circuit that receives a power down signal and generates an inverted power down signal. The electronic device further comprising a pulse generating circuit that receives the inverted power down signal and generates an output pulse signal and a load transistor that receives the output pulse signal and generates a pre-selected storage signal that has a sufficient pulse width to change the magnetic state of the GMR storage cell when detecting that the power to the electronic device is being lost.

BRIEF DESCRIPTION OF THE DRAWINGS

These and other aspects, advantages, and novel features of the invention will become apparent upon reading the following detailed description and upon reference to the accompanying drawings. In the drawings, similar elements have similar reference numerals.

DETAILED DESCRIPTION OF THE PREFERRED EMBODIMENT

Figure 1A:
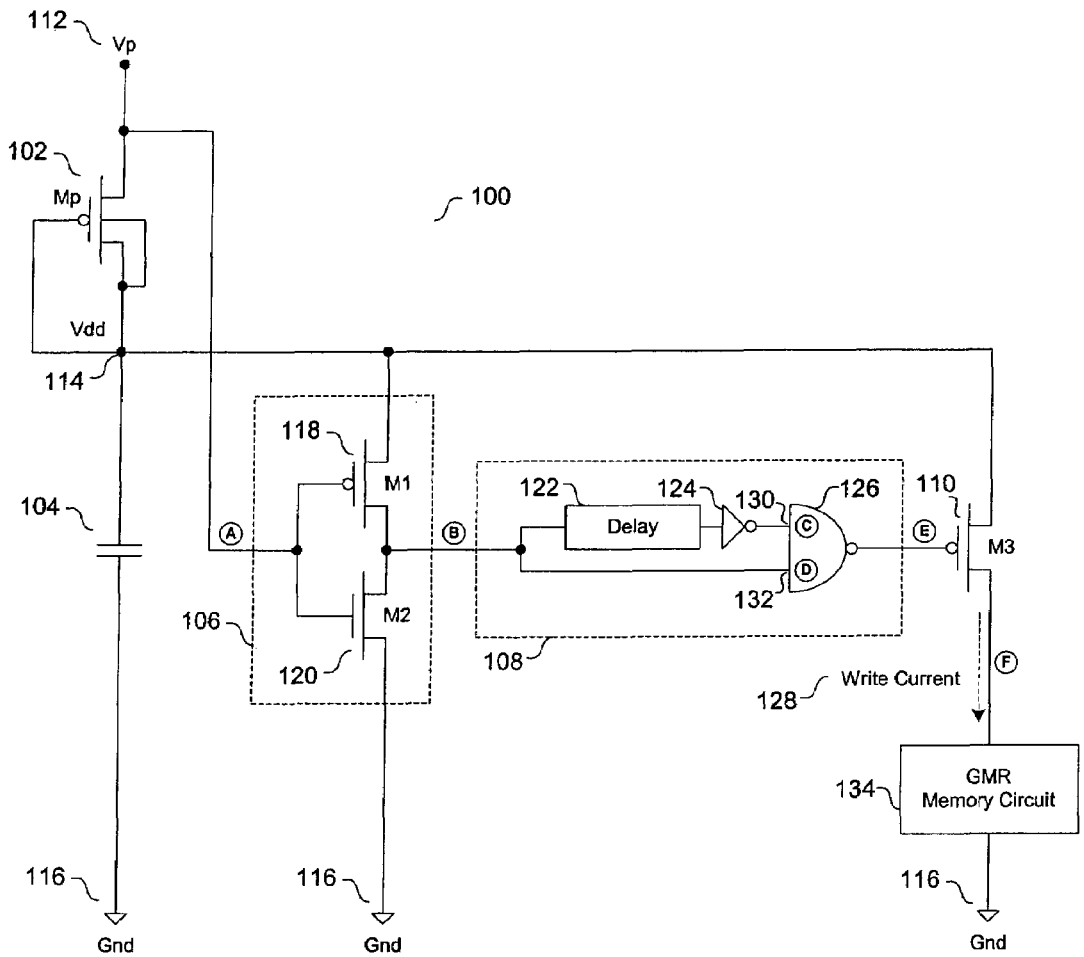
FIG. 1A illustrates one embodiment of a save-on-power-down circuit.

Reference will now be made to the drawings wherein like numerals refer to like parts throughout. FIG. 1A illustrates one embodiment of a save-on-power-down circuit 100. The save-on-power-down circuit 100 comprises an isolation transistor (Mp) 102, a charge storage device (C) 104, an inverter circuit 106, a positive-edge-triggered pulse generating circuit 108, and a load transistor (M3) 110. The isolation transistor 102, in this implementation, may comprise a p-channel metal-oxide semiconductor field effect transistor (MOSFET), wherein the substrate terminal is connected to the source terminal. Additionally, the drain terminal of the isolation transistor 102 may be connected to a supply voltage (Vp) 112, and the gate terminal and the source terminal of the isolation transistor 102 are connected to the node 114, which may be preferably raised to the potential of an operating voltage (Vdd). In one aspect, the charge storage device 104 may be preferably a capacitor with a capacitance value of approximately a few hundred pico-farads. The charge storage device 104 may be formed with a gate oxide structure for an on-chip integrated fabrication. Furthermore, an upper terminal of the charge storage device 104 may be connected to the node 114, and the lower terminal of the charge storage device 104 may be connected to a ground terminal 116.

The inverter circuit 106 comprises a first transistor (M1) 118, such as a p-channel MOSFET, and a second transistor (M2) 120, such as an n-channel MOSFET 120. In this particular embodiment, the inverter circuit 106 utilizes complementary metal-oxide semiconductor (CMOS) technology. In addition, at a node (A) the gate terminals of the first transistor 118 and the second transistor 120 are connected to the drain terminal of the isolation transistor 102. Moreover, the source terminal of the first transistor 118 may be connected to the node 114, and the drain terminal of the first transistor 118 may be connected to the drain terminal of the second transistor 120. The source terminal of the second transistor may be connected to the ground terminal 116. It should be appreciated that the positioning, orientation, and configuration of the inverter circuit 106 may be altered by one skilled in the art without departing from the scope of the invention. Furthermore, the purpose and functionality of the inverter circuit 106 will be discussed in greater detail herein below.

The positive-edge-triggered pulse generating circuit 108 may comprise a delay circuit 122, an inverter gate 124, and a NAND gate 126. In one aspect, the delay circuit 122 may comprise an even number of inverter gates, such as the inverter gate 124, that may be interconnected in manner known in the art so as to provide a signal timing delay. Additionally, an input terminal of the delay circuit 122 may be connected to the drain terminals of the first and second transistors 118, 120 of the inverter circuit 106 at a node (B), and an output terminal of the delay circuit 122 may be connected to an input terminal of the inverter gate 124. An output terminal of the inverter gate 124 may be connected to a first input terminal 130 of the NAND gate 126 at a node (C), and a second input terminal 132 of the NAND gate 126 at a node (D) may be connected to the drain terminals of the first and second transistors 118, 120. Therefore, any signals appearing at the node (B) may be mirrored and transfer to the node (D). An output terminal of the NAND gate 126 may be connected to a gate terminal of the load transistor 110 at a node (E). Furthermore, the source terminal of the load transistor 110 may be connected to the node 114, and the drain terminal of the load transistor 110 may be connected to a memory circuit 134, such as integrated circuitry comprising one or more GMR storage devices, at a node (F).

Figure 2:
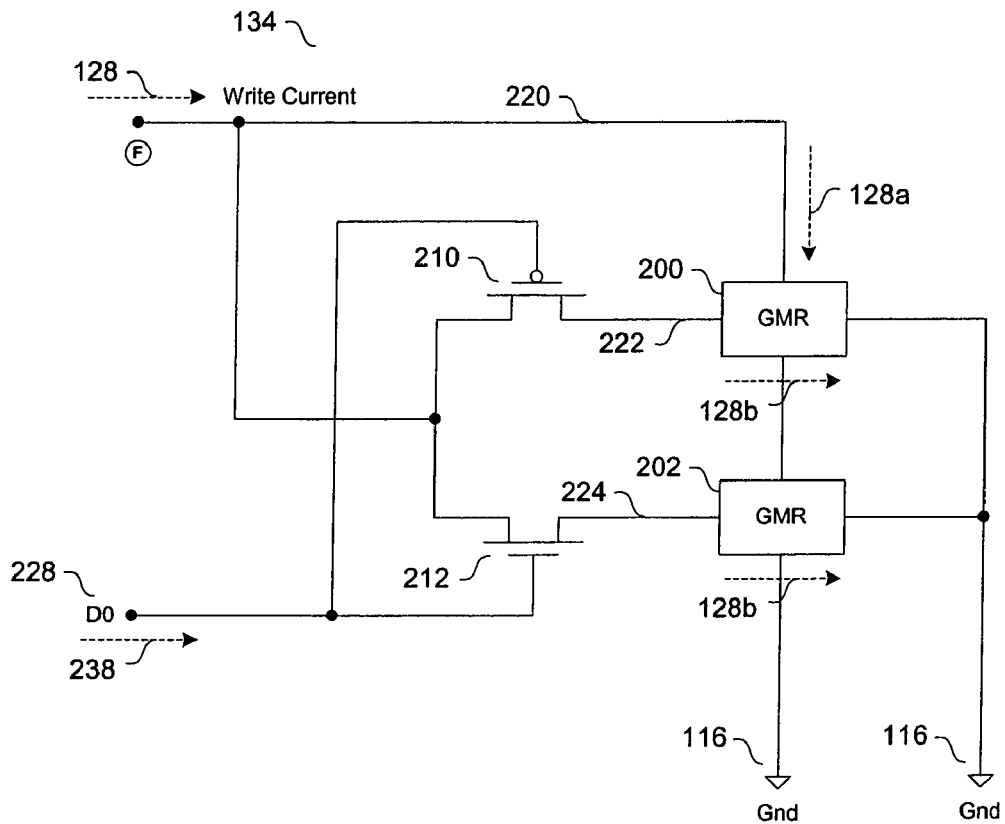
FIG. 2 illustrates one embodiment of a GMR memory circuit.

Advantageously, the load transistor 110 provides a write current 128 at the node (F) that may be used to provide a write current to the one or more magneto-resistive storage devices and/or GMR storage devices in a non-volatile manner such that the logic state may be preserved at power-down. FIG. 2 illustrates one possible embodiment of the GMR memory circuit 134 that may be used to store logic states in a non-volatile manner. The GMR memory circuit may comprise GMR storage elements 200, 202, access transistors 210, 212, conductive traces 220, 222, 224, and a data input terminal (D0) 228. While the following description of the GMR memory circuit 154 provides an example of a type of GMR circuit that may be used with the save-on-power-down circuit 100 of the illustrated embodiment, it should be appreciated by a person of ordinary skill in the art that the save-on power-down circuit 100 and the inventive features illustrated herein may be used with any of a number of GMR circuit configurations without departing from the scope of the present invention.

In one aspect, the circuit node F may comprise a first input node that may supply the write current 128 to the GMR memory circuit 134 via the drain terminal of the load transistor 110 in FIG. 1A. The write current 128 may be supplied to the drain terminals of the first and second access transistors 210, 212 and to the GMR storage elements 200, 202 via a first conductive trace 220. Additionally, the source terminal of the first access transistor 210 may provide a second conductive trace 222 to the first GMR storage element 200 that is substantially perpendicular to the first conductive trace 220, wherein the intersection point of the first and second conductive traces 220, 222 may be proximate to the first GMR storage element 200. Also, the source terminal of the second access transistor 212 may provide a third conductive trace 224 to the second GMR storage element 202 that is also substantially perpendicular to the first conductive trace 220, wherein the intersection point of the first and third conductive traces 220, 224 may be proximate to the second GMR storage element 202. Moreover, the data input terminal 228 may be electrically connected to the drain terminals of the access transistors 210, 212. It should be appreciated that the terminal ends of the conductive traces are electrically connected to the common ground 116.

In one embodiment, as illustrated in FIG. 2, the first access transistor 210 may comprise a p-channel MOSFET device and the second access transistor 212 may comprise an n-channel MOSFET device. The input voltage sensed at the input data terminal 228 may be configured to select either the first or the second access transistor 210, 212. For example, a low voltage signal 138 at the input data terminal 228 may select the first access transistor 210, wherein a voltage potential of approximately zero volts turns the gate of the p-channel MOSFET 210 "on" and the gate of the n-channel MOSFET 212 "off" in a generally known manner. Conversely, a high voltage signal 138 at the input data terminal 228 may select the second access transistor 210, wherein a voltage potential of approximately 3 to 5 volts turns the gate of the n-channel MOSFET 212 "on" and the gate of the p-channel MOSFET 210 "off" in a generally known manner.

Once the input voltage of the data signal selects the desired access transistor 210, 212, the write current 128 is transferred to the corresponding GMR storage element 200, 202 via at least one of the access transistors 210, 212. As illustrated in FIG. 2, the GMR memory circuit 134 is configured to supply the GMR storage elements 200, 202 a first write current 128a and a second write current 128b that is substantially perpendicular to the first write current 128a. For example, if the input data signal is a logic "0", then the first GMR storage element 200 changes logic states in response to the first and second write currents 128a, 128b. Similarly, if the input data signal is a logic "1", then the second GMR storage element 202 changes logic states in response to the first and second write currents 128a, 128b. Therefore, the logic state of the input data signal may be stored in the corresponding GMR storage element 200, 202. Advantageously, the GMR memory circuit 134 is configured to store the logic state of the input data signal at the terminal 228 in a non-volatile manner at power down. It should be appreciated that the GMR memory circuit 134 may further comprise supporting circuitry without departing from the scope of the present invention. For example, the GMR memory circuit 134 may comprise a power-up circuit that programs a default logic state into the GMR storage elements 200, 202. In addition, the GMR memory circuit 134 may comprise a logic state sensing circuit that reads the logic states of the GMR storage elements 200, 202.

It should be appreciated that the GMR memory circuit 134 may comprise one or more control circuits that are configured to read one or more defined logic states of one or more volatile storage devices and write the defined logic states to non-volatile storage devices, such as a magneto-resistive storage devices, wherein the write current may be used to write to magneto-resistive storage devices in a manner as described in the Assignee's issued U.S. Pat. No. 6,178,111 (application Ser. No. 09/455,850), which is hereby incorporated by reference in its entirety. In one embodiment, the patent discloses a device and method for writing defined logic states to one or more magneto-resistive storage devices. Current switches are provided for directing an input, such as a write current, through a number of write lines to control the programmable write state of the magneto-resistive storage devices. In addition, a sense current may be utilized to selectively control which magneto-resistive storage devices are written to a particular logic state. Furthermore, a latching element may be used to sense the state of the magneto-resistive storage devices so as to assume a corresponding logic state.

Figure 3:
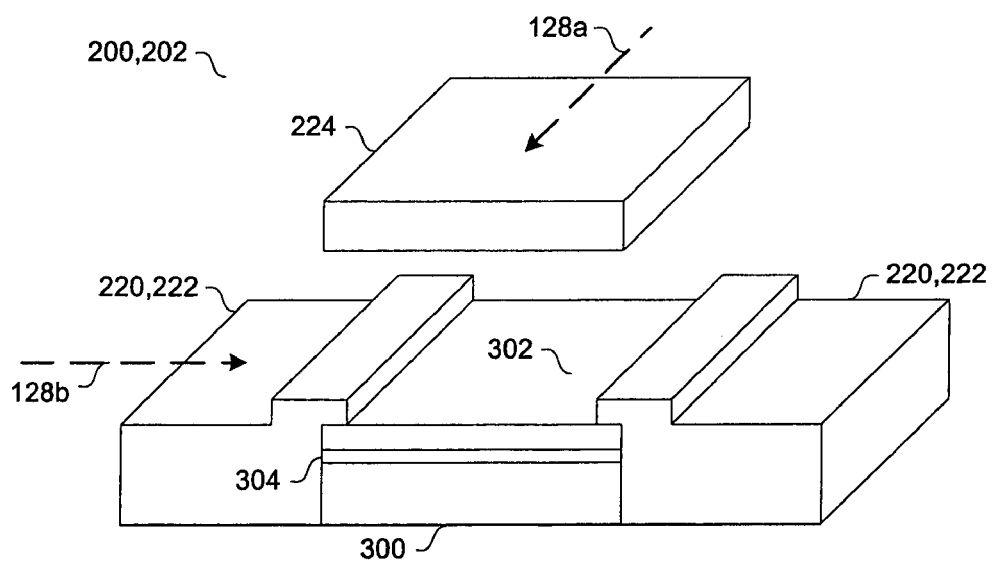
FIG. 3 illustrates one embodiment of a GMR storage element.

FIG. 3 illustrates one embodiment of the GMR storage element 200, 202 that may be used in the GMR memory circuit 134. In one aspect, GMR storage devices employ a developing technology that offers the advantages of non-volatility and high-density fabrication. GMR devices utilize the spin property of electrons within layers of magnetic material to read and write the memory storage logic states. Binary logic states typically take advantage of a resistance differential to distinguish between "on" and "off" states. Resistance is a measure of the inability of an electrical current to flow through a specific material, whereas current is the flow of charge carriers through a material. If a material comprises a high resistance, then the ability of electrons to flow through the material may be inhibited. Conversely, a low resistive material may tend to allow a higher degree of current to flow.

Additionally, GMR devices utilize this resistance concept by manipulating the alignments of spin states within multiple layers of material to increase or decrease the resistance of a material. For example, GMR magnetic layers may comprise a magnetic pinned layer 300 and a magnetic sense layer 302 separated by a thin spacing layer 304. The magnetic layers 300, 302 may comprise magnetic material, such as NiFe, CoFe, NiCoFe, wherein the pinned layer 300 is thicker than the sense layer 302. In one aspect, the two magnetic layers 300, 302 may comprise mismatched magnetic properties such that the thinner sense layer 304 may tend to switch at a lower magnetic field than the thicker pinned layer 300. In Pseudo-Spin Valve (PSV) configured memory cells as illustrated in FIG. 3, the spacing layer 304 may comprise copper (Cu). Alternatively, in generally known Tunneling Magnetic Junction (TMJ) memory cells, the spacing layer 304 may comprise a dielectric material, such as Aluminum-oxide ($Al_2O_3$). It should be appreciated that various types of magneto-resistive memory elements may be used in place of the illustrated PSV memory cell by one skilled in the art without departing from the scope of the present invention.

In one embodiment, the magnetic pinned layer 300 may be magnetized in a first fixed direction, the magnetic sense layer 302 may be magnetized in either the first fixed direction or a second direction that is opposite the first direction. The selective programmability of the sense layer 302 enables the GMR device to perform as a logic state device, which stores binary data as directions of net magnetization vectors in the magnetic layers 300, 302. Current flow through two orthogonal conductive traces 220, 222, 224 induces a magnetic moment that switches the orientation of the magnetic sense layer 302 to a parallel or anti-parallel configuration with respect to the magnetic pinned layer 300. The overall GMR resistance has low and high values when the net magnetization vectors of the two individual magnetic layers 300, 302 orient in substantially the same (parallel) and opposite (antiparallel) directions, respectively. For example, the corresponding parallel and antiparallel magnetization states represent two different resistances, wherein the high and low resistance states represent a logical "1" or "0," respectively. When these materials are layered in a particular fashion, they exhibit a differential electrical resistance across the structure depending on the magnetization state of the individual layers.

Referring now back to FIG. 1A, the charge storage device 104, in one embodiment, may provide the write current 128 to the GMR memory circuit 134 for writing to one or more GMR storage elements. In addition, the isolation transistor 102 may provide an in diode-connection mode, wherein the isolation transistor 102 supplies power to the entire circuit 100 when the supply voltage (Vp) 112 is in a "normally on" state. In one aspect, the "normally on" state may be defined by the relationship of $|V_p|>V_{dd}|+|V_{Mp}|$. Additionally, during a power-off event the isolation transistor (Mp) 102 may begin to cutoff, wherein $|V_p|<|V_{dd}|+|V_{Mp}|$. Therefore, when $|V_p|<|V_{dd}|$, the isolation transistor (Mp) 102 may be cutoff, which isolates the operating voltage (Vdd) at the node 114 from the supply voltage (Vp) 112. When $|V_p|<|V_{dd}|-|V_{MP}|$, the inverter circuit 106 formed by the first transistor (M1) 118 and the second transistor (M2) 120 combination begins to turn on the positive-edge-triggered pulse generating circuit 108.

In one aspect, the save-on-power-down circuit 100 produces a positive-level pulse at the drain terminal of the load transistor 110 at a node (F) when $|V_p|<|V_{DD}|-|V_{Mp}|$. The positive-edge-triggered pulse generating circuit 108 inputs a positive-edge signal at the node (D), which is the second input terminal 132 of the NAND gate 126, while producing a delayed negative-edge signal at the node (C), which is the first input terminal 130 of the NAND gate 126. The delayed negative-edge signal may be produced by the delay circuit 122 and the inverter 124. At the output terminal of the NAND gate 126, a negative-level pulse may be produced at the node (E) with a width controlled by the delay circuit 122.

The value of the timing delay may be in the range of a few nanoseconds, which may be pre-determined by the time required to write to the GMR memory circuit 134. As previously discussed, the delay circuit 122 may be implemented by an interlinked chain of an even number of inverter gates. It should be appreciated that, in this particular positive-edge-triggered pulse generating circuit, an odd number of inverter gates are assumed to be present between the delay circuit 122 and the first input terminal 130 of the NAND gate 126. Without departing from the scope of the present invention, it should also be appreciated that the inputs 130, 132 of the NAND gate 126 may be switched without affecting the output signal from the output terminal of the NAND gate 126. Input and output signal descriptions will be further discussed in greater detail below with reference to FIG. 1B.

Additionally, the output terminal of the positive-edge-triggered pulse generating circuit 108 produces an input to the gate terminal of the load transistor (M3) 110. In one embodiment, the magnitude of the output signal from the drain terminal of the load transistor 110 may be determined by the amount of current required to write to the GMR storage element as well as the impedance of the GMR memory circuit 134. In one aspect, a preferred current to write to the GMR storage element may be in the range of 10 mA to 35 mA, and a preferred width (W) and length (L) value for the load transistor 110 may be in the ratio of a few hundred microns for W and around 0.35 $\mu$m for L. In another aspect, when the load transistor (M3) 110 conducts from the source terminal to the drain terminal, the write current 128 flows from the charge storage element 104 to the GMR memory circuit 134.

Implementing the above-mentioned save-on-power-down circuit 100 into computing, logic, and memory devices offers many advantages for storing binary logic states and/or digital information in a non-volatile manner. For one, the save-on-power-down circuit 100 primarily draws direct current (DC) when writing to the GMR storage element during a power failure event (e.g., when $|V_p|<|V_{dd}|-|V_{MP}|$) and primarily draws alternating current (AC) to maintain the operation of the various supporting circuits. Another advantage may be that the save-on-power-down circuit 100 provides a mechanism for storing the logic state of a volatile memory component into the non-volatile GMR storage element prior to a power failure and/or as the power failure may be occurring. Moreover, the charge storage device 104 may be preferably charged prior to sensing a power interrupt or failure, wherein a charge may be normally stored in the charge storage element 104 until power down is sensed by the isolation transistor 102.

In one aspect, since the writing time to the GMR storage element may be a few nanoseconds or less, the save-on-power-down circuit 100 may be capable of providing non-volatile buffering of the circuit/logic state in the event of a power failure or during the event of a power down situation.

Furthermore, the save-on-power-down circuit 100 may be embeddable in a manner such that the save-on-power-down circuit 100 may be fabricated with other integrated circuit elements or components with standard CMOS fabrication technology and may also be integrated with other GMR elements or components. In another aspect, the save-on-power-down circuit 100 may be used with latch circuits, logic circuits, memory circuits, system-on-a-chip circuits, etc., and generally when there may be a desire, need, or requirement for the preservation of critical information or critical logic states in the event of a power failure or the occurrence of a power down situation.

Figure 1B:
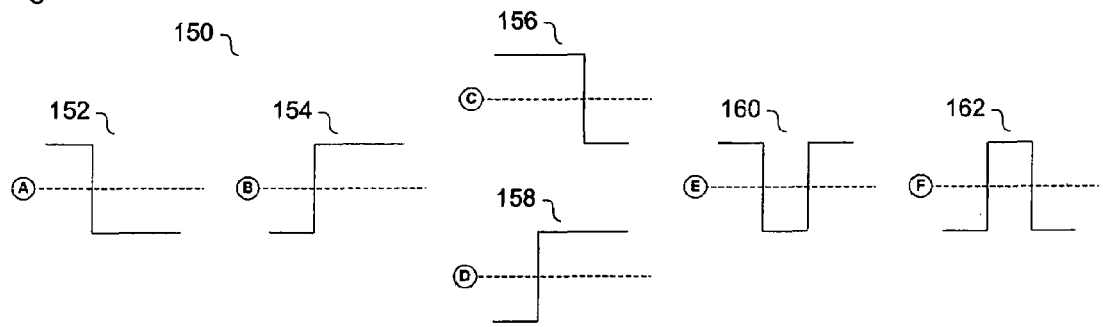
FIG. 1B illustrates one embodiment of a pulse generation timing diagram.

FIG. 1B illustrates one embodiment of a pulse generation timing diagram 150. For purposes of discussion clarity, FIG. 1B will be discussed with reference to FIG. 1A. For explanative purposes, a high voltage state at the gate terminal of a MOSFET refers to a voltage that is capable of inducing an n-channel MOSFET into an operational state and reducing a p-channel MOSFET into a non-operational state. Conversely, a low voltage state at the gate terminal of a MOSFET refers to a voltage that is capable of reducing an n-channel MOSFET into a non-operational state and inducing a p-channel MOSFET into an operational state.

In one embodiment, the inverter circuit 106 operates as follows. When a low voltage state appears at the input terminal at a node (A) of the inverter circuit 106, the low voltage state may be transferred to the gate terminals of the transistors 118, 120. The low voltage state at the gate terminal of the first transistor 118 induces the p-channel of the first transistor 118 into an operational state and allows current to flow from the source terminal to the drain terminal of the first transistor 118. Conversely, the low voltage state at the gate terminal of the second transistor 120 induces the n-channel of the second transistor 120 into a non-operational state and prevents current flow between the drain terminal and the source terminal of the second transistor 120. Therefore, the potential at the output terminal at a node (B) of the inverter circuit 106 may be substantially similar to the potential at the node 114 when a low voltage state appears at the gate terminals of the first and second transistors 118, 120.

Alternatively, when a high voltage state appears at the input terminal 114 of the inverter circuit 100, which refers to the "normally on" state, the potential at the output terminal at the node (B) may be substantially similar to the potential at the ground terminal 116. The high voltage state also appears on the gate terminals of the first and second transistors 118, 120 rendering the first transistor 118 to a non-operational state and the second transistor 120 to an operational state. Since the output voltage at the output terminal is low, current sinks through the second transistor 120 from the node (B) to the ground terminal 116. In one aspect, the inverter circuit 106 produces an inverted output signal relative to an input signal. The purpose and functionality of the inverter circuit 106 will be discussed in greater detail herein below.

In one embodiment, a power down signal 152 may be representative of supply signal (Vp) 112 during a power down or power failure occurrence that may be supplied to the input terminal of the inverter circuit 106 at a node (A). In one aspect, the power down signal 152 may be a negative-edge-triggered signal that switches from a high voltage signal to a low voltage signal, which simulates a power down situation. The inverter circuit 106 inverts the power down signal 152 and generates an inverted power down signal 154 at a node (B). In addition, the inverted power down signal 154 may be a positive-edge-triggered signal that switches from a low voltage state to a high voltage state.

From the node (B), the inverted power down signal 154 may be split into a first and second component signal that may be substantially identical to the inverted power down signal 154. The first component signal of the inverted power down signal 154 may be transferred to the input terminal of the delay circuit 122, where the timing of the first component signal may be delayed in a manner that was discussed previously with reference to the delay circuit 122. The delayed first component signal may then be transferred to the inverter 124, where the inverter 124 generates the delayed-inversion of the first component signal 156 at a node (C), which is the first input terminal of the NAND gate 126. The delayed-inversion of the first component signal 156 is a negative-edge-triggered signal that switches from a high voltage state to a low voltage state.

Simultaneously, the second component signal of the inverted power down signal 154 may be transferred to the second input terminal of the NAND gate 126 at a node (D) and is illustrated as the second NAND gate input signal 158. The signal 158 is a positive-edge-triggered signal that switches from a low voltage state to a high voltage state. The signals 156, 158 are inverted from each other, and the signal 156 may be delayed by a pre-determined amount from the signal 158. From these signals 156, 158 as inputs to the NAND gate 126, the NAND gate 126 generates a negative-level pulse signal 160 at a node (E), which may be the output terminal of the NAND gate 126. Furthermore, the negative-level pulse signal 160 may be transferred to the gate terminal of the load transistor 110, and the switching of the gate terminal of the load transistor 110 produces a positive-level pulse signal 162 at a node (F), which may be indicative of the source terminal output of the load transistor 110. The positive-level pulse signal 162 may then be transferred to the GMR memory circuit 134. In one embodiment, the positive-level pulse signal 162 may be used to write to a GMR storage element for the purpose of storing a pre-defined logic state and/or valuable digital information in a non-volatile manner.

Figure 4:
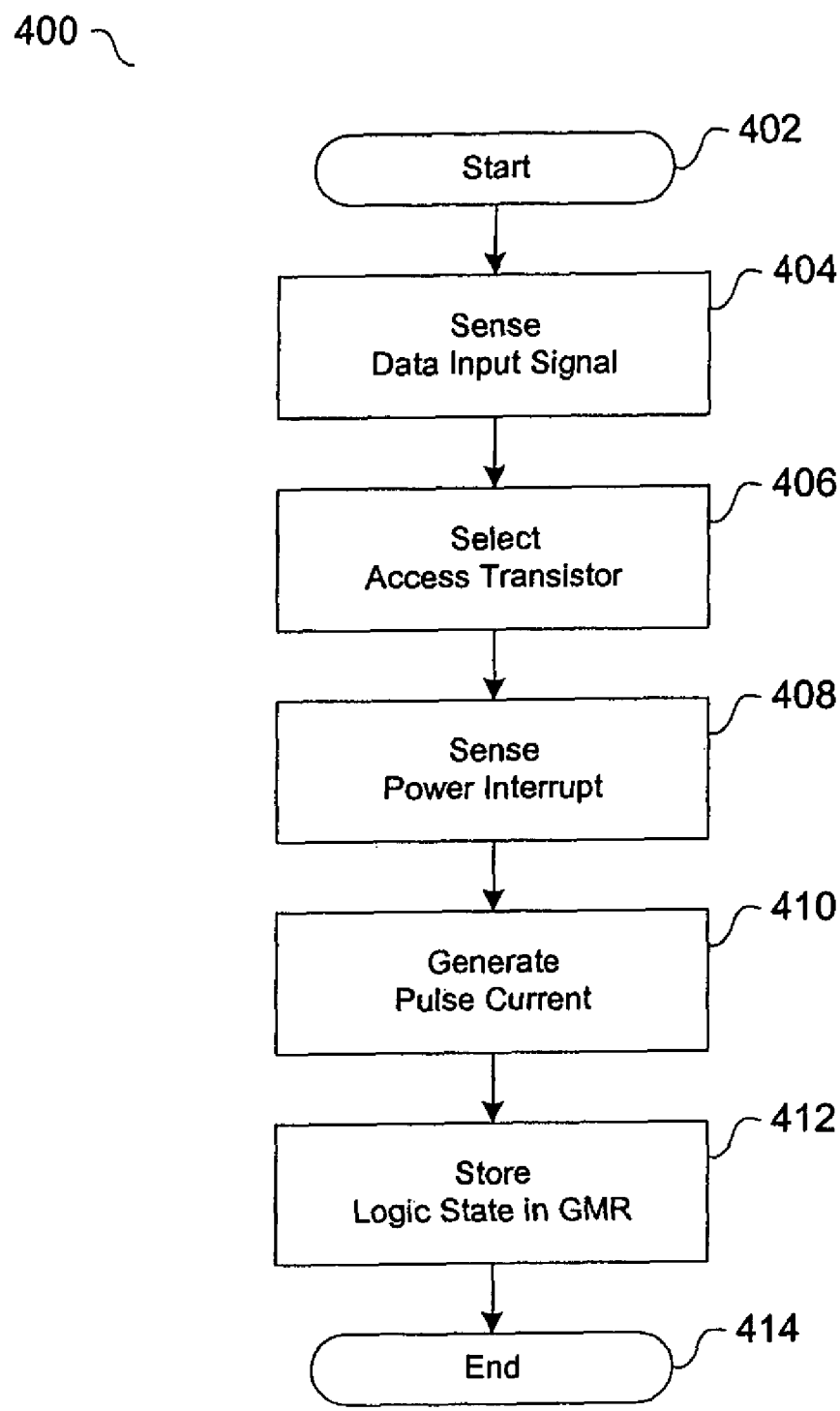
FIG. 4 illustrates one embodiment of a GMR storage process flow.

FIG. 4 illustrates one embodiment of a GMR storage process flow 400 that may be used to store at least one volatile logic state to at least one memory element, such as the GMR storage elements 200, 202, in a non-volatile manner. It should be appreciated that the GMR storage process 400 will be described in conjunction with the previous FIGS. 1A–3.

The process initiates in a start state 402 and proceeds to a state 404, where the GMR storage circuit 134 senses the logic state of the data input signal 238 at the terminal 228. Depending on the sensed logic state of the data input signal 238, the corresponding access transistor 210, 212 is selected in a manner as previously described with reference to FIG. 2. In a state 408, when the save-on-power-down circuit 100 senses a power interrupt in a manner as described in FIG. 1A, the save-on-power-down circuit 100 generates a pulse current, such as the write current 128, in a state 410 and supplies the write current 128 to the GMR memory circuit 134. In a state 412, upon receiving the write current 128, the GMR memory circuit 134 stores the logic state of the data input signal 238 in the selected GMR storage element 200, 202 in a manner as previously described with reference to FIGS. 2, 3. Subsequently, after storing the received logic state in the selected GMR storage element 200, 202, the GMR storage process 400 terminates in an end state 414.

The advantage of non-volatile storage elements, such as a GMR storage element, is that logic states, such as binary logic states and digital information sequences, may be stored in a non-power dependent status. Therefore, at start-up or initialization of a computing device that comprises non-volatile storage elements, the most recent retained logic states are preserved. In one aspect, preserved logic states may be accessed in a significantly immediate manner without delay from having to charge capacitors in DRAM modules or transfer data from hard drives to SRAM and/or DRAM modules. As a result, the above-mentioned save-on-power-down circuit of the present invention reduces the risk of losing binary logic states and/or digital information in a power interrupt situation, such as a inadvertent power failure or a voluntary power shutdown sequence.

Traditional volatile storage devices fail to retain the binary logic states and/or digital information in a power interrupt situation. Consequently, conventional memory devices, such as SRAM and DRAM need to be replaced with improved non-volatile storage devices. The increased demand for a significantly advanced, efficient, and non-volatile data retention technique has driven the development of integrated giant magneto-resistive (GMR) structures. Advantageously, the present invention relates to non-volatile logic state retention devices, such as GMR storage elements, and concerns a save-on-power-down circuit that may be integrated with conventional semiconductor-based computing, logic, and memory devices to retain volatile logic states and/or volatile digital information in a non-volatile manner.

Although the following description exemplifies one embodiment of the present invention, it should be understood that various omissions, substitutions, and changes in the form of the detail of the apparatus, system, and/or method as illustrated as well as the uses thereof, may be made by those skilled in the art, without departing from the spirit of the present invention. Consequently, the scope of the present invention should not be limited to the disclosed embodiments, but should be defined by the appended claims.

What is claimed is:

1. A memory device having a data line and a GMR storage circuit comprising:
   at least one GMR storage cell that is coupled to the data line wherein the GMR storage cell magnetically stores a value indicative of the value of the data line upon receipt of a pre-selected storage signal;
   a power down detector that detects when power to the memory device is being lost and generates the pre-selected storage signal, wherein the power down detector is adapted to provide a pre-selected storage signal that has a sufficient pulse width to change the magnetic state of the GMR storage cell when detecting that the power to the memory device is being lost.

2. The device of claim 1, wherein the power down detector includes a charge storage device that stores charge during normal operation of the memory device and wherein the charge storage device provides the charge when the power is being lost to develop the pre-selected storage signal.

3. The device of claim 2, wherein power down detector includes a pulse generating circuit that receives the charge and converts the charge into a pulse output signal having a pulse width.

4. The device of claim 3, wherein the pulse generating circuit includes a logic gate having a first and second input and a delay circuit wherein the charge from the charge storage device is simultaneously applied directly to the first input of the logic gate and to the delay circuit and wherein the delay circuit provides an input signal to the second input of the logic gate a pre-selected time period after the application of the charge to the first input of the logic gate.

5. The device of claim 4, wherein the logic gate provides the pulse output signal that changes from a first state to a second state upon receipt of the input signal on the first input and then changes back to the first state upon receipt of the input signal from the delay circuit on the second input such that the output from the logic gate comprises a pulse output signal that is in the second state for a pre-selected pulse width.

6. The device of claim 5, wherein the logic gate comprises a NAND gate and the second state comprises a negative state.

7. The device of claim 5, further comprising an output transistor that receives charge from the charge storage device and wherein the output transistor is activated by the pulse output signal such that the charge from the charge storage device is transmitted through the output transistor to the GMR device to produce the pre-selected storage signal.

8. The device of claim 1, further comprising an isolation transistor interposed between the charge storage device and the power supply.

9. The device of claim 8, further comprising an inverter that is coupled to the power supply so as to provide an output to the pulse generating circuit that is a rising edge signal in response to receiving a falling edge signal from the power supply indicative of the power to the memory device being lost.

10. The device of claim 1, wherein the at least one GMR storage cell comprises at least one of a first magnetic layer that is magnetized in a first fixed direction, a second layer that can be magnetized in either the first fixed direction or a second direction that is opposite the first direction, and a spacing layer interposed between the first magnetic layer and the second magnetic layer.

11. The device of claim 1, wherein the GMR storage circuit comprises a first conductive trace and second conductive trace that is substantially perpendicular to the first conductive trace, wherein the intersection point at which the first and second conductive traces is proximate to the at least one GMR storage cell.

12. The device of claim 11, wherein a first component of the pre-selected storage signal is provided to the at least one GMR storage cell via the first conductive trace.

13. The device of claim 12, wherein the GMR storage circuit comprises at least one access transistor interposed between the data line and the GMR storage cell, and wherein a second component of the pre-selected storage signal is provided to the at least one GMR storage cell via the second conductive trace upon activation by the data line.

14. An electronic device having a data line and a GMR storage cell, the device comprising:
   an isolation transistor that senses a power failure and isolates a supply voltage from an operating voltage;
   a charge storage device that stores the operating voltage and discharges the operating voltage when the power failure is sensed by the isolation transistor;
   an inverter circuit that receives a power down signal and generates an inverted power down signal;
   a pulse generating circuit that receives the inverted power down signal and generates an output pulse signal; and
   a load transistor that receives the output pulse signal and generates a pre-selected storage signal that has a sufficient pulse width to change the magnetic state of the GMR storage cell when detecting that the power to the electronic device is being lost.

15. The device of claim 14, wherein the electronic device further comprises a charge storage device that stores charge during normal operation of the electronic device and wherein the charge storage device provides the charge when the power is being lost to develop the pre-selected storage signal.

16. The device of claim 15, wherein the pulse generating circuit receives the charge and converts the charge into the output pulse signal having a pulse width.

17. The device of claim 16, wherein the pulse generating circuit includes a logic gate having a first and second input and a delay circuit wherein the charge from the charge storage device is simultaneously applied directly to the first input of the logic gate and to the delay circuit and wherein the delay circuit provides an input signal to the second input of the logic gate a pre-selected time period after the application of the charge to the first input of the logic gate.

18. The device of claim 17, wherein the logic gate provides the pulse output signal that changes from a first state to a second state upon receipt of the input signal on the first input and then changes back to the first state upon receipt of the input signal from the delay circuit on the second input such that the output from the logic gate comprises a pulse output signal that is in the second state for a pre-selected pulse width.

19. The device of claim 18, wherein the logic gate comprises a NAND gate and the second state comprises a negative state.

20. The device of claim 18, wherein the load transistor receives charge from the charge storage device and wherein the load transistor is activated by the output pulse signal such that the charge from the charge storage device is transmitted through the load transistor to produce the pre-selected storage signal.

21. The device of claim 14, wherein the isolation transistor is interposed between the charge storage device and the power supply.

22. The device of claim 21, wherein the inverter circuit is coupled to the power supply so as to provide an output to the pulse generating circuit that is a rising edge signal in response to receiving a falling edge signal from the power supply indicative of the power to the electronic device being lost.

23. The device of claim 14, wherein the at least one GMR storage cell comprises at least one of a first magnetic layer that is magnetized in a first fixed direction, a second layer that can be magnetized in either the first fixed direction or a second direction that is opposite the first direction, and a spacing layer interposed between the first magnetic layer and the second magnetic layer.

24. The device of claim 14, wherein the electronic device further comprises a first conductive trace and second conductive trace that is substantially perpendicular to the first conductive trace, wherein the intersection point at which the first and second conductive traces is proximate to the at least one GMR storage cell.

25. The device of claim 24, wherein a first component of the pre-selected storage signal is provided to the at least one GMR storage cell via the first conductive trace.

26. The device of claim 25, wherein the GMR storage circuit comprises at least one access transistor interposed between the data line and the GMR storage cell, and wherein a second component of the pre-selected storage signal is provided to the at least one GMR storage cell via the second conductive trace upon activation by the data line.

27. A method of data retention during a power interrupt, the method comprising:
  detecting the power interrupt;
  developing a pulse signal having a sufficient pulse width to change the magnetic state of at least one GMR storage cell upon detecting the power interrupt;
  supplying the developed pulse signal to the at least one GMR storage cell while simultaneously supplying a data input signal to the at least one GMR storage cell; and
  magnetically storing the supplied input data signal in the at least one GMR storage cell using the developed pulse signal upon receiving the supplied pulse signal.

* * * * *